United States Patent
Chen et al.

(10) Patent No.: US 10,621,386 B1
(45) Date of Patent: Apr. 14, 2020

(54) METHOD OF BIAS TEMPERATURE INSTABILITY CALCULATION AND PREDICTION FOR MOSFET AND FINFET

(71) Applicants: Cadence Design Systems, Inc., San Jose, CA (US); Peking University, Beijing (CN)

(72) Inventors: Alvin Chen, San Jose, CA (US); Jushan Xie, San Jose, CA (US); Si-Yu Liao, Beijing (CN); Chunyi Huang, Beijing (CN); Tianlei Guo, Beijing (CN); Yanhui Li, Beijing (CN); Runsheng Wang, Beijing (CN); Shaofeng Guo, Beijing (CN); Zhuoqing Yu, Beijing (CN); Ru Huang, Beijing (CN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 387 days.

(21) Appl. No.: 15/464,116

(22) Filed: Mar. 20, 2017

(51) Int. Cl.
  *G06F 17/10* (2006.01)
  *G06F 30/367* (2020.01)
  *G06F 17/50* (2006.01)

(52) U.S. Cl.
  CPC .................. *G06F 30/367* (2020.01)

(58) Field of Classification Search
  CPC .................................................. G06F 17/5036
  USPC ................................................ 703/2, 13, 14
  See application file for complete search history.

(56) References Cited

U.S. PATENT DOCUMENTS

| | | | |
|---|---|---|---|
| 8,290,759 B1* | 10/2012 | Mu | G06F 17/5036 703/13 |
| 2010/0097091 A1* | 4/2010 | Shih | G01R 31/2858 324/750.03 |
| 2014/0096098 A1* | 4/2014 | Weir | G06F 17/5009 716/112 |
| 2016/0069950 A1* | 3/2016 | Chen | G01R 31/2855 |

* cited by examiner

*Primary Examiner* — Andre Pierre Louis
(74) *Attorney, Agent, or Firm* — McDermott Will & Emery LLP (57) ABSTRACT

A method, a system and a non-transitory machine-readable storage medium are provided. In one or more aspects, a computer-implemented method for bias temperature instability (BTI) calculation of a device includes simulating the device, using an electronic design automation tool. The simulation includes determining a first degradation value after applying a first sequence of stress values to the device for a first plurality of time steps. The simulation further includes determining a first degradation recovery value after the first plurality of time steps. The simulation further includes determining a first recovered degradation value after the first plurality of time steps by combining the first degradation value and the first degradation recovery value. The first degradation value, the first degradation recovery value, and the first recovered degradation value are associated with one or more model parameters of the device. The simulation is a transient analysis simulation, and the device is a FINFET or MOSFET device.

19 Claims, 6 Drawing Sheets

METHOD OF BIAS TEMPERATURE INSTABILITY CALCULATION AND PREDICTION FOR MOSFET AND FINFET

TECHNICAL FIELD

The present disclosure generally relates to electronic design automation (EDA), and more specifically relates to bias temperature instability calculation and prediction of fin field-effect transistor (FINFET) and MOS field-effect transistor (MOSFET) devices in EDA tools.

BACKGROUND

Metal-oxide-semiconductor (MOS) devices are faced with reliability issues that affect transistors' electrical characteristics such as drain on-current, off-current, leakage current, etc. For example, device electrical parameters including carrier mobility ($\mu$), threshold voltage ($V_{th}$) can be degraded as the MOS device ages over time. One of the most reliability concerns in MOS devices is commonly referred to as bias temperature instability (BTI) degradation. The aging of the device can be studied, for example, by simulating the device using an electronic design automation (EDA) tool while a stress is applied to the device. Examples of stress applied to the device under simulation include bias stress and temperature stress. For instance, a device is under bias and/or temperature stress if a bias voltage or current and/or a temperature with a value higher than nominal value is applied to the device.

A conventional method of calculating BTI degradation of a device in the existing reliability prediction tools is to sum the degradations that occurred in a number of time steps during a transient analysis to find a total degradation. The total degradation is then extrapolated to a long-term period such as a defined aging time, by using a time dependent only relation, to obtain a predicted degradation value for the defined aging time. The extrapolation is often performed based on a power law or a logarithmic equation. The degradation recovery may be calculated in a similar way, or even further simplified.

Current measurement results of advanced fin field-effect transistor (FinFET) devices demonstrate that neither the stress nor the recovery degradation is following a simple mathematical function. More importantly, the degradation recovery depends on the device's degradation state that has been observed in both FinFET and conventional MOSFET devices. Therefore, the existing approach for BTI calculation cannot work for FinFET technology, which involves using more complex mathematical models. The approach for FinFET technology involves accounting for the degradation recovery dependence on the current state of degradation of devices, which can be either FinFET or MOSFET transistors.

SUMMARY

The disclosed systems and methods provide for bias temperature instability (BTI) calculation and prediction of fin field-effect transistor (FINFET) and conventional MOSFET devices in EDA tools using the device degradation history. The method is not dependent on a specified form of mathematic models, and can accept a generic BTI reliability model. The disclosed method is not limited to computing device degradation in semiconductor devices, but can be applicable in other domains, such as automotive, Internet of things (IoT), low power applications, high performance computing, and the like.

According to certain aspects of the present disclosure, methods and systems are provided. In one or more aspects, a computer-implemented method for bias temperature instability (BTI) calculation of a device uses the simulation results of the device generated by an electronic design automation (EDA) tool. The simulation includes determining a first degradation value after applying a first sequence of stress values to the device for a first plurality of time steps. The simulation further includes determining a first degradation recovery value after the first plurality of time steps. The simulation further includes determining a first recovered degradation value after the first plurality of time steps by combining the first degradation value and the first degradation recovery value. The first degradation value, the first degradation recovery value, and the first recovered degradation value are associated with a parameter of the device. The simulation results are transient analysis simulation results, and the device is a FINFET or MOSFET.

According to certain aspects of the present disclosure, a system for BTI calculation of a device includes a server to perform a transient analysis simulation of the device and a workstation communicatively coupled to the server to provide a degradation model and a degradation recovery model to the server. The server is configured to determine, using the degradation model, a first degradation value after applying a first sequence of stress values to the device for a first plurality of time steps. The server is further configured to determine, using the degradation recovery model, a first degradation recovery value after the first plurality of time steps. The server is further configured to determine a first recovered degradation value after the first plurality of time steps by combining the first degradation value and the first degradation recovery value. The first degradation value, the first degradation recovery value, and the first recovered degradation value are associated with a parameter of the device, and the device comprises a FINFET or an MOSFET device.

According to certain aspects of the present disclosure, a non-transitory machine-readable storage medium including machine-readable instructions for causing a processor to execute a method for BTI calculation of a device uses a transient analysis simulation. The method includes determining, using an arbitrary degradation model, a degradation value after applying a sequence of stress values to the device for a plurality of time steps. The method further includes determining, using an arbitrary degradation recovery model, a degradation recovery value after the plurality of time steps. The method further includes determining a recovered degradation value after the plurality of time steps by combining the degradation value and the degradation recovery value. The degradation value, the degradation recovery value, and the recovered degradation value are associated with a parameter of the device, and the device is a FINFET or an MOSFET device.

According to certain aspects of the present disclosure, a system for BTI calculation of a device includes means for performing a transient analysis simulation (e.g., a server) of the device, and means for providing models (e.g., a workstation) including a degradation model and a degradation recovery model to the server. The means for providing models is communicatively coupled to the means for performing the transient analysis simulation. The means for performing the transient analysis simulation is configured to determine, using the degradation model, a first degradation value after applying a first sequence of stress values to the device for a first plurality of time steps. The means for performing the transient analysis simulation is further configured to determine, using the degradation recovery model, a first degradation recovery value after the first plurality of time steps. The means for performing the transient analysis simulation is further configured to determine a first recovered degradation value after the first plurality of time steps by combining the first degradation value and the first degradation recovery value. The first degradation value, the first degradation recovery value, and the first recovered degradation value are associated with a parameter of the device, and the device comprises a FINFET or an MOSFET device.

According to certain aspects, a system for BTI calculation of a device is described. The system includes a memory comprising instructions, and a processor. The processor is configured to execute the instructions to perform a transient analysis simulation of the device, and receive a degradation model and a degradation recovery model from a workstation. The processor is further configured to execute the instructions to determine, using the degradation model, a first degradation value after applying a first sequence of stress values to the device for a first plurality of time steps, and determine, using the degradation recovery model, a first degradation recovery value after the first plurality of time steps. The processor is configured to execute the instructions to determine a first recovered degradation value after the first plurality of time steps by combining the first degradation value and the first degradation recovery value. The first degradation value, the first degradation recovery value, and the first recovered degradation value are associated with a parameter of the device.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed systems and methods provide a bias temperature instability (BTI) calculation and prediction method for fin field-effect transistor (FINFET) and metal-oxide-semiconductor field-effect transistor (MOSFET) devices in EDA tools using device degradation history. The implementation of history effect is based on calculation of the degradation accumulation and relaxation at each time step in a transient simulation analysis. At each time step, both the stress degradation and degradation recovery values are calculated. Furthermore, the degradation recovery value calculation is based on the degradation status of a previous time step. Combining the stress degradation and degradation recovery values, the recovered degradation with recovery effect can be progressively calculated for the entire transient simulation time.

In one or more aspects, the subject technology uses the simulation results of the device generated by an electronic design automation (EDA) tool. The simulation results describe the electrical behavior of a device during the defined transient time. During the transient simulation, the defined simulation time has been divided as plurality of sequences which are recognized as time steps or time steps. The calculation method includes determining the due degradation occurred from the first time step, then one time step following the first time step, until the final time step in the entire simulation of the device. The simulation results are a transient analysis simulation, and the device is a FINFET or MOSFET.

According to certain aspects, in each time step, the BTI calculation method of a device first determines the degradation value after applying a sequence of stress values to the device such as electrical voltages or currents. The calculation further includes determining the degradation recovery value with the after the degradation value of the previous time step. The calculation further includes determining the recovered degradation value in the end of the current time step by combining the determined degradation value and degradation recovery value.

In one or more aspects, the calculation of a degradation or recovery value in a time step requires the degradation status of its previous time step. For the first plurality of time steps in a transient simulation time, the degradation of the device is recognized as zero. The calculation of a degradation or recovery value in a time step further introduces the degradation status of the previous time step with an effective time of degradation or recovery. The effective time of degradation or recovery translates the degradation or recovery time to achieve the previous degradation status with the stress condition of the current time step. Indeed, the degradation or recovery value obtained in the method at the end of a time step is calculated with the calculated effective time and the duration under the stress condition of the current stress sequence. Thus the history of the degradation status of the device during the simulation can be reproduced by this calculation method. In some aspects, to calculate a degradation or recovery value, the method uses a degradation or recovery model. Since the calculation method is a generic solution, no specified mathematical form of reliability models is required and an arbitrary BTI model of degradation or recovery can be used.

The disclosed solution enables using a suitable extrapolation method to efficiently obtain a substantially accurate prediction of long-term device total stress degradation. The subject solution is advantageous over the conventional method, in which values for the delta degradation generated at individual time steps are calculated separately and summed up to arrive at the total stress degradation. In the subject method disclosed herein, calculations of the stress phase and recovery phase take into account the status of the degradations in previous time steps of the transient simulation time in each step. Therefore, at the end of the transient simulation time, the stress degradation and degradation recovery values are the total values of their respective phases. The subject solution allows the degradation accumulation and recovery associated with complex and more accurate model equations than linear and power law equations.

Example System Architecture

Figure 1:
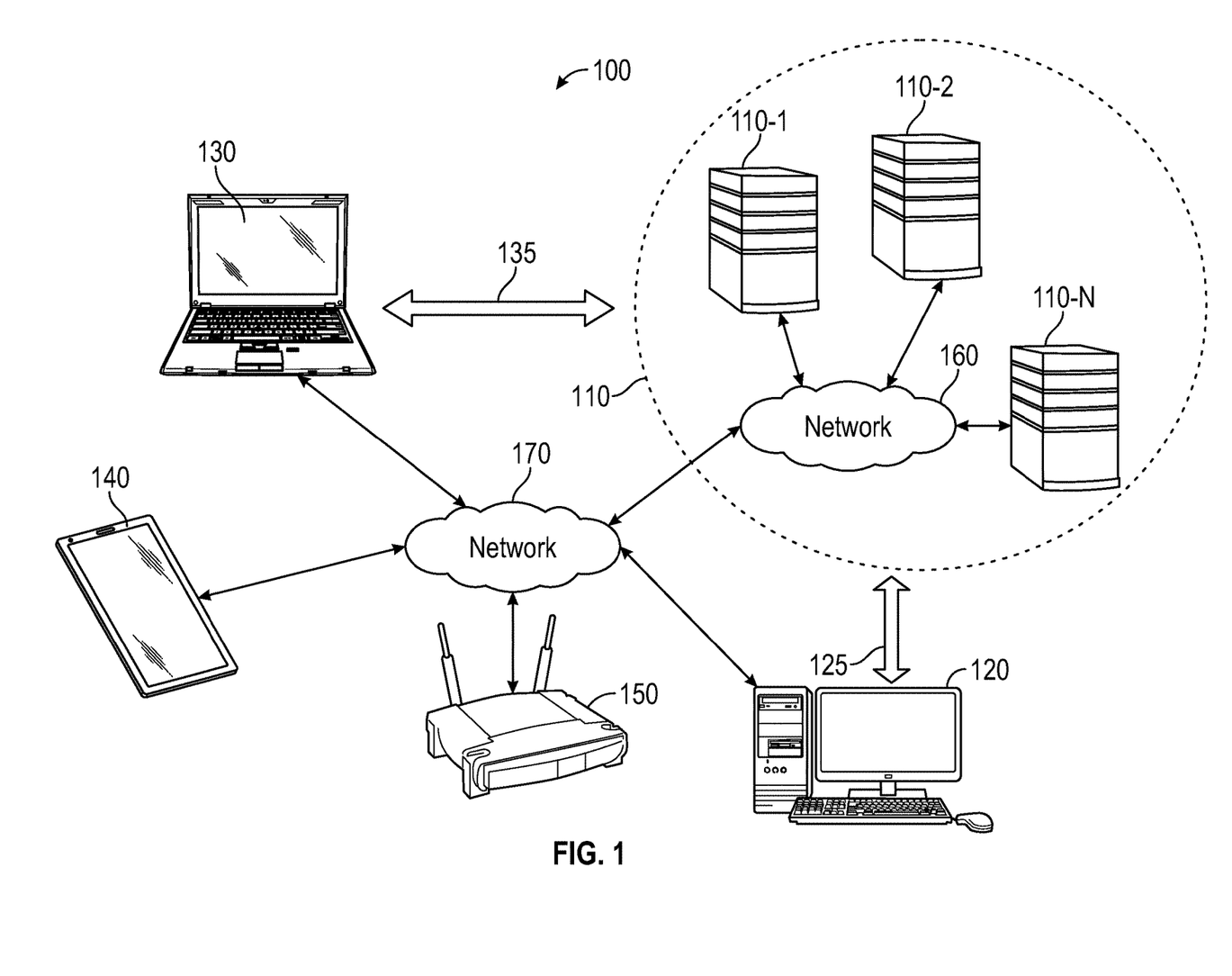
FIG. 1 illustrates an example environment in which the subject technology is used.

FIG. 1 illustrates an example environment in which the subject technology is used. The architecture 100 includes a server farm 110 including a number of servers (e.g., 110-1, 110-2 . . . 110-N) communicatively coupled through a network 160 and a computing device (e.g., a workstation) 120 coupled to one or more of the servers of the server farm 110 via a communication link 125. In some aspects of the disclosure, the architecture 100 includes a mobile computer 130, a mobile device (e.g., a smartphone or PDA) 140, and an access point 150 communicatively coupled via a network 170. In one or more aspects, one or more of the servers of the server farm 110 and the workstation 120 are also connected to the network 160 directly or via the network 170. The access point 150 may facilitate communication of various computers and devices with the network 170. Examples of the networks 160 and 170 include any one or more of a personal area network (PAN), a local area network (LAN), a campus area network (CAN), a metropolitan area network (MAN), a wide area network (WAN), a virtual private network (VPN), a broadband network (BBN), the Internet, and the like. Further, the networks 160 and 170 can include, but are not limited to, any one or more of the following network topologies, including a bus network, a star network, a ring network, a mesh network, a star-bus network, a tree or hierarchical network, and the like.

In some aspects, the mobile computer 130 is also capable of using a more robust and higher bandwidth communication link 135 similar to the communication link 125 for communicating with one or more servers of the server farm 110. In some aspects, the mobile computer 130 can have the capabilities of performing the functionalities of the workstation 120 and be actually used to perform those functionalities as disclosed herein. The servers 110 can be any device having an appropriate processor, memory, and communications capability for hosting simulation services, for example, simulation of analog and digital circuitry. The workstation 120 or the mobile computer 130 can support simulations by, for example, providing input samples for simulation runs performed by the servers of the server farm 110. In some aspects, one or more of the servers 110 can be a cloud computing server of an infra-structure-as-a-service (IaaS) and be able to support platform-as-a-service (PaaS) and software-as-a-service (SaaS).

In some aspects, the simulation runs can be hosted by the workstation 120 and/or the mobile computer 130. In one or more aspects, the simulations use electronic design automation (EDA) software that can be utilized for simulation of various electronic circuit designs including analog and/or digital integrated circuit designs at the intellectual-property (IP) and block level.

In some aspects, the communication links 125 and 135 are high bandwidth and low latency communication channels (e.g., interfaces). The interfaces can optimize performance and functionality when providing a transactional interface, such as between the workstation 120 or the mobile computer 130 and one or more servers of the server farm 110. In one or more aspects, a user may access the workstation 120 or the mobile computer 130 via the mobile device 140, for example, to initiate transfer of one or more files or other transactions between the workstation 120 or the mobile computer 130 and the servers of the server farm 110.

In one or more aspects, the subject technology applies transient analysis simulations of a device such as an advanced (e.g., newer technology node) CMOS or FINFET device for BTI calculation and prediction. The prediction is based on the device degradation history which includes the device stress degradation and recovery history over a number of time steps during a defined transient time. The simulations may be performed by, for example, one or more of the servers 110, the workstation 120, and/or the mobile computer 130. In some aspects, the workstation 120, and/or the mobile computer 130 provide stress degradation and degradation recovery models as software modules for being used by the EDA simulation tool. In one or more aspects, the stress degradation and degradation recovery models are integrated with the EDA simulation tool.

Figure 2:
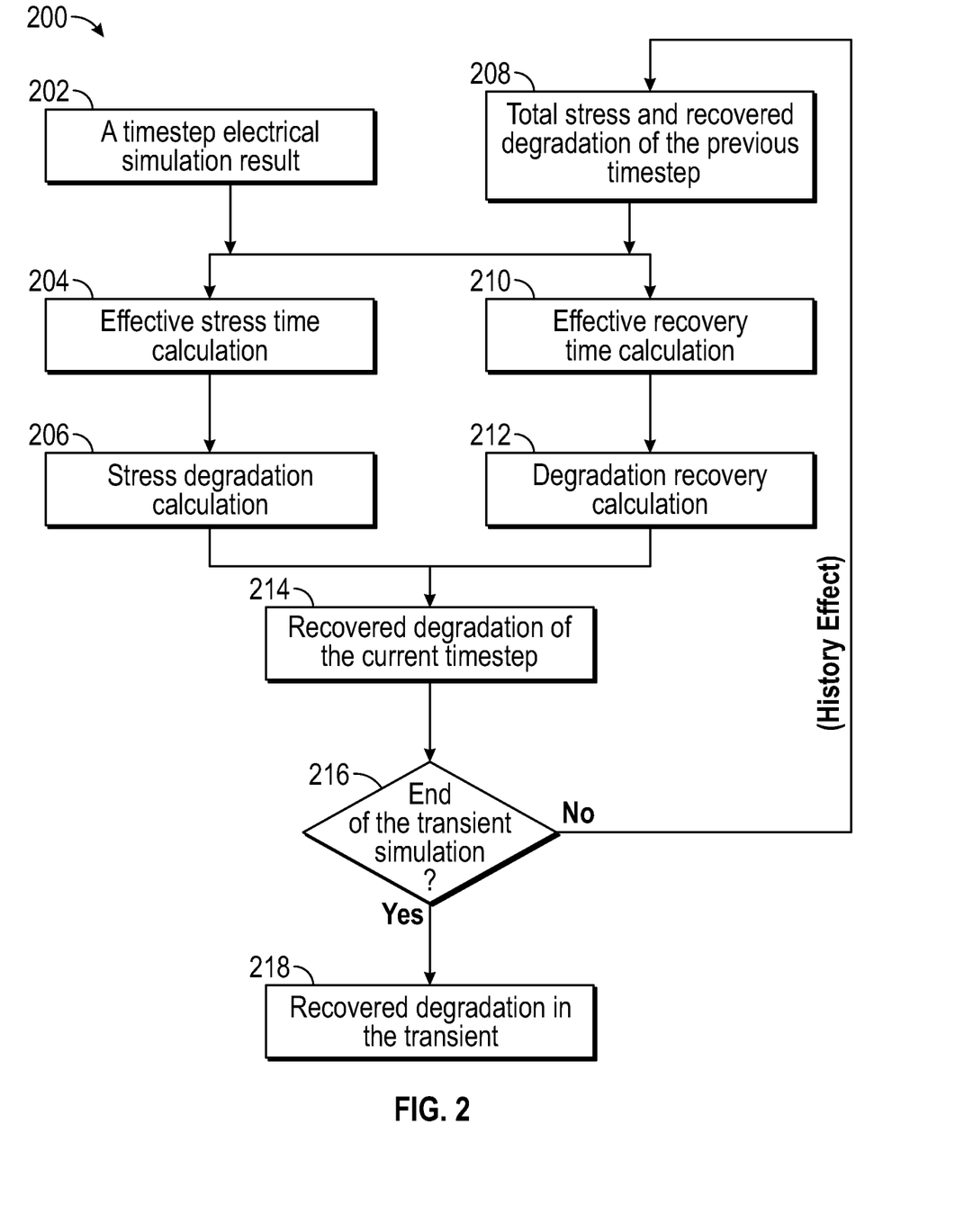
FIG. 2 is a flow diagram illustrating an example process for bias temperature instability (BTI) calculation of a device according to certain aspects of the disclosure.

FIG. 2 is a flow diagram illustrating an example process 200 for bias temperature instability (BTI) calculation of a device according to certain aspects of the disclosure. The process 200 begins by collecting a transient simulation of the device, at step 202. The transient simulation is a time dependent simulation, in which a model of the specified electronic device is simulated by one or more transient inputs such as a voltage bias under certain temperature. In the context of the current disclosure, the device can be a MOSFET or a FINFET. For the purpose of the disclosed BTI calculations, the simulations involve applying a type of stress to the device under simulation and observing the device behavior including stress degradation and degradation recovery, as described herein.

In some aspects, the applied stress can be an electrical bias such as a bias current or voltage under a stressing temperature with a magnitude (value) that exceeds a nominal value. For example, the nominal value of a bias voltage applied between gate and source terminals (e.g., Vgs) of a MOSFET or FINFET device is about 1V. The nominal value for operating temperature of the semiconductor devices (e.g., MOSFET and FINFET) depends on the application and can be within several ranges. The transient simulation may apply a time varying stress by sweeping the bias voltage or the temperature for a user-defined transient time. For example, the stress may be applied as a sequence of pulses over a number of time steps for the duration T of the transient simulation time. The result (output) of the transient simulation is a time response to the applied stress. In some aspects, the time response can be a variation over time of some parameters of the device, for example, a charge-carrier (e.g., electron or hole) mobility, a threshold voltage, a ON-state current and the like.

Figure 3A:
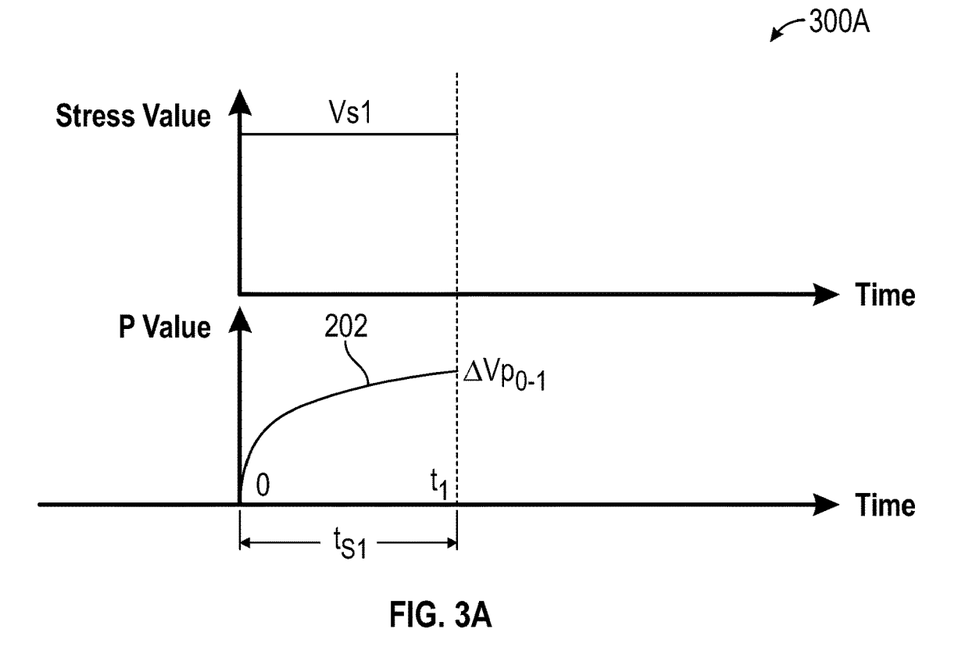
FIGS. 3A-3B are diagrams illustrating example BTI stress degradation calculations according to certain aspects of the disclosure.
Figure 3B:
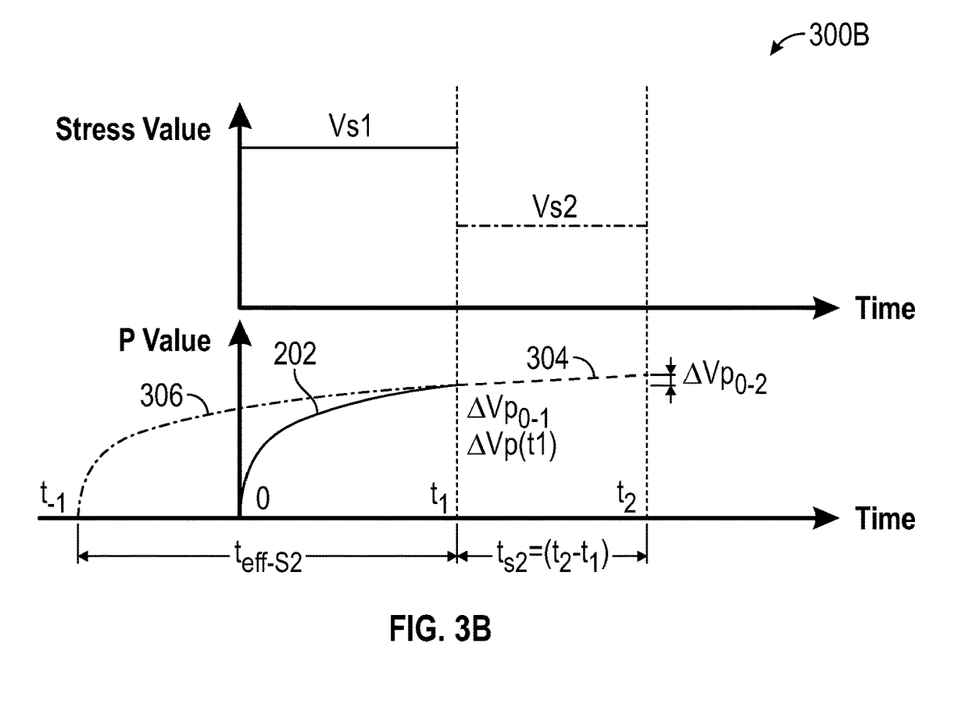

For the purpose of BTI stress degradation calculations, as shown in diagrams 300A and 300B of FIGS. 3A-3B, the stress can be the Vgs voltage and one of the parameters P can be the threshold voltage (Vth). For example, the diagram 300A of FIG. 3 shows the first time step $t_{s1}$, over which a stress value of Vs1 is applied to the device. During the time step $t_{s1}$, the change in value of parameter P from an initial value (e.g., Vth=0.4V) is represented by $\Delta V_{p0-1}$ (e.g., 0.02V) that denotes a change from time 0 the time $t_1$. The plot 202 denotes the degradation behavior of the parameter P under the applied stress and is defined by a degradation model applied to the simulation. A change $\Delta V_{p0-1}$ in the value of the parameter P represents a stress degradation, which is calculated by the simulation, based on the degradation model. For MOSFET or FINFET devices, simpler models including linear or power law equations may not be suitably represent the actual degradation behavior of these devices. And more complex equations such as logarithmic equations or combination of logarithmic equations and power law equations may be used to better describe the stress degradation behavior of the devices. One of the advantageous features of the subject solution is that the degradation calculations are not model dependent and complex model of choice of a user can be applied.

Returning to the flow diagram of FIG. 2, at step 204, effective stress time calculation is performed as discussed herein with respect to diagram 300B FIG. 3B. The diagram 300B shows two time steps of the sequence of time steps of the transient simulation. Over the first time step (t=0 to $t_1$) the stress value is Vs1 that changes to Vs2 for the second time step (t=$t_1$ to $t_2$). The stress degradation value of the parameter P at the end of the first time step, $\Delta Vp(t_1)$, is equal to $\Delta V_{p0-1}$ and due to the lesser value of the stress at the second time step (Vs2<Vs1), would increases quite slowly to a value of $\Delta V_{p0-2}$, if there was no degradation recovery. In other words, the plot section 304 is not a natural continuation of the behavior shown with the plot 202 (e.g., the applied degradation model). Based on the applied degradation model, the plot section 304 can be considered to be a continuation (tail) of a hypothetical plot 306, which intersects the time axis at point $t_{-1}$, which is before the start of the first time step. The time between $t_{-1}$ and $t_1$ denoted by $t_{eff-S2}$ is the effective stress time associated with the stress value Vs2. Expressed differently, the effective stress time can be defined as a time duration corresponding to a degradation of the parameter P if only the last stress value (Vs2) was applied for the entire time duration between $t_{-1}$ and $t_1$ denoted by $t_{eff-S2}$.

In the absence of the degradation recovery, the time, $t_{eff-S2}+(t_2-t_1)$ can be conceived as an effective duration time for stress Vs2. In other words, the value of $\Delta V_{p0-2}$ for stress degradation at time $t_2$ (e.g., $\Delta Vp(t_2)$) can be thought of as the result of a stress with a value of Vs2 being applied for time duration of $t_{eff-S2}+(t_2-t_1)$.

Again, returning to the flow diagram 200 of FIG. 2, at step 206, the stress degradation calculation without recovery for the current time step (e.g., $t_{s2}$), at time $t_2$ is calculated as being $\Delta Vp(t_2)=\Delta V_{p0-2}$, which is slightly higher than the value at the end of the first step.

Figure 4A:
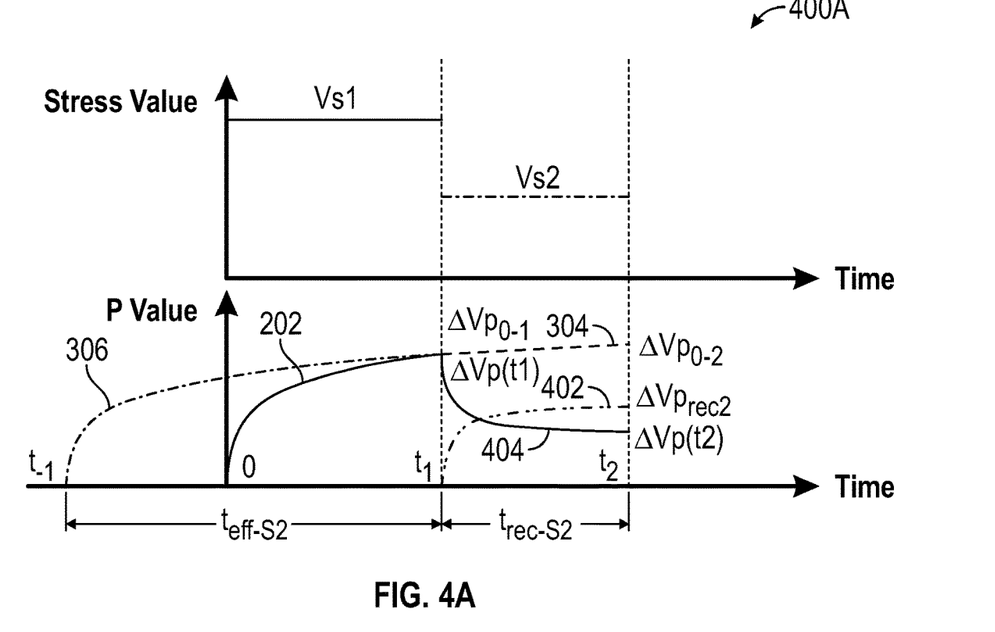
FIGS. 4A-4B are diagrams illustrating example BTI stress degradation recovery calculations according to certain aspects of the disclosure.

In the next step 208 of the flow diagram 200, total stress and recovered degradation of the previous time step (e.g., $t_{s2}$) are calculated, the result of which are shown in the diagram 400A of FIG. 4A. In the diagram 400A, the plots 202 and 304 are as described above with respect to FIG. 3B. In reality, the stress degradation plot 202 calculated for the first time $t_{S1}$ does not continue as the plot 204, when the recovered degradation is taken into account. As shown by the plot 402, the degradation recovery starts from the time $t_1$ and grows to a value of $\Delta Vp_{rec2}$ at time $t_2$, according to a recovery model integrated to the simulation software. In some implementations, the subject solution allows for the recovery model to be chosen by the user and has no restriction on the recovery model chosen. For example, the recovery model can include complex equations including logarithmic and/or power law equations without limitations. The summation of the recovery plot 402 and the stress degradation plot 304 in the time step $t_{s2}$, results in the recovered degradation as shown by a plot 404 of the first recovered degradation, which has a value of $\Delta Vp(t_2)$ at time $t_2$. The value $\Delta Vp(t_2)$ is significantly different from the value of $\Delta V_{p0-2}$ calculated when the recovery was not taken into account. It is understood that in the summation of the recovery plot 402 and the stress degradation plot 204, the values of the recovery plot have to be applied with a minus sign.

Figure 4B:
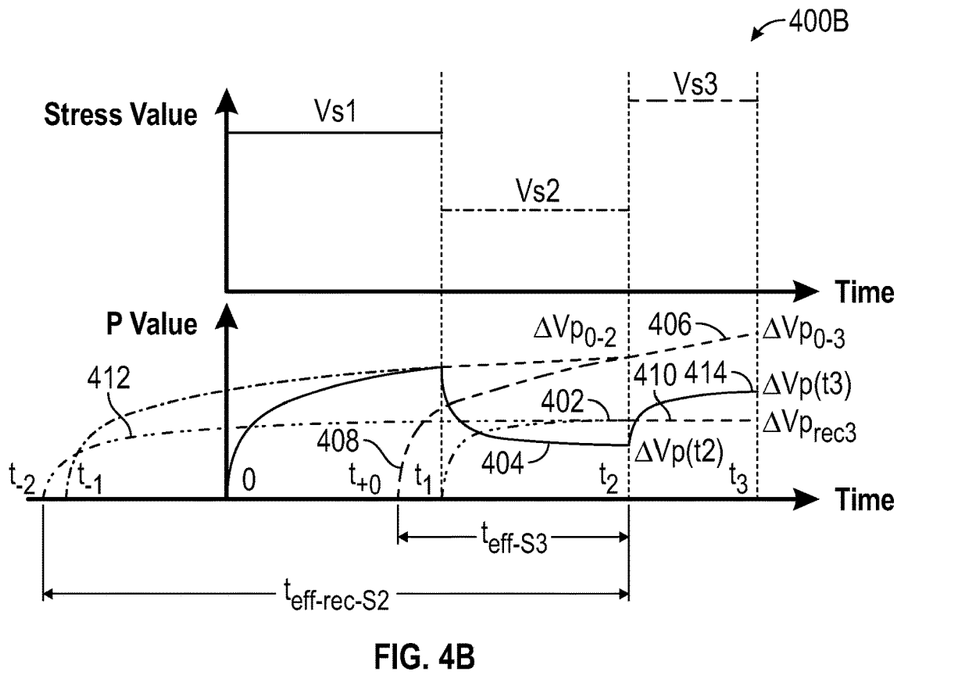

Returning to the flow diagram of FIG. 2, at step 210, effective recovery time calculation is performed, as described herein with respect to a diagram 400B of FIG. 4B. As shown by the diagram 400B, a third stress with a value of Vs3 is applied to the device at a third time starting from the time $t_2$ and continuing until time $t_3$. The value of Vs3 is selected to be higher than both Vs1 and Vs2. As a result, the stress degradation grows in the third time step as shown by the plot 406. As described above, with respect to $t_{eff-S2}$, for the stress Vs3, a similar effective stress time $t_{eff-S3}$, can be calculated that is associated with a plot 408 and starts at a time $t_{+0}$ and continues to the time $t_2$. The effective stress time $t_{eff-S3}$ is larger than $t_{S3}$ of the third time step. The recovery of the second time step, as represented by the plot 402, seems to remain steady without any growth as shown by a plot 410, due to the high value (Vs3) of the stress in the third time step. Similar to the concept of effective stress time, explained above, for the recovery plot 410, one can imagine a hypothetical behavior shown by the plot 412, which starts at a time $t_2$, before the time 0, and continues to have a value of $\Delta Vp_{rec3}$ at the time $t_3$. The effective recovery time $t_{eff-rec-S2}$, as shown in the diagram 400B, is the effective recovery time for Vs2, in the presence of the third stress Vs3 of the third time step.

Again, returning to the flow diagram 200 of FIG. 2, at a step 212 degradation recovery is calculated for the second and third time steps, as shown by the plots 402 and 410 discussed above.

At a step 214 of the flow diagram 200, the recovered degradation of the current time step ($t_{S3}$) is calculated by summation of the recovery plot 410 and the stress degradation plot 406 in the time step $t_{s3}$, resulting in a recovered degradation as shown by a plot 414 of the second recovered stress degradation, which has a value of $\Delta Vp(t_3)$ at time $t_3$.

The value $\Delta Vp(t_3)$ is significantly different from the value of $\Delta Vp_{0-3}$ calculated when the recovery was not taken into account. It is understood that in the summation of the recovery plot 410 and the stress degradation plot 406, the values of the recovery plot 410 have to be applied with a minus sign.

Returning to the flow diagram 200 of FIG. 2, at control step 216, it is checked whether the time $t_3$ is the end of the transient simulation time (T). If the answer is no, control is returned to step 208, where the calculations described above continues for a next time step, until the transient simulation time T is reached. The time associated with the stress degradation and the recovered degradation are the respective effective times as explained above.

At step 218 of the flow diagram 200, after the transient simulation time T is reached, the current stress degradation and recovered degradation values for the transient simulation time T are stored in memory (e.g., memory of the servers 110, workstation 120, and/or mobile computer 130). For example, if the last time step in the transient simulation time T is the third time step, the value $\Delta Vp_{0-3}$ is the final stress degradation (without recovery) and $\Delta Vp(t_3)$ is the recovered stress degradation value, which are both stored for degradation prediction calculations, as explained herein.

Figure 5:
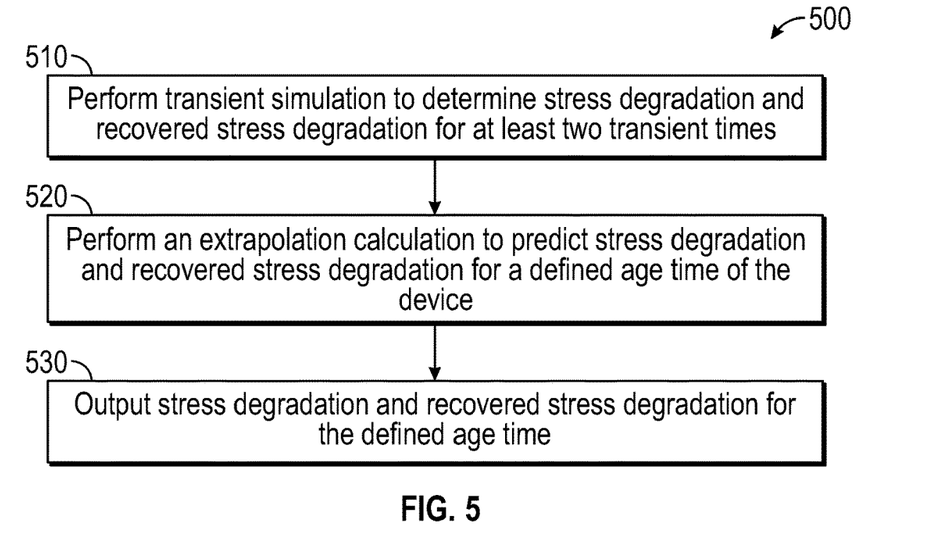
FIG. 5 is a diagram illustrating an example BTI prediction method according to certain aspects of the disclosure.

FIG. 5 is a diagram illustrating an example BTI prediction method 500 according to certain aspects of the disclosure. The BTI prediction method 500 begins by proceeding to step 510, when the transient simulation is performed by applying a sequence of stress values to the device, for a number of time steps, as described above with respect to FIGS. 2, 3A-3B, and 4A-4B. The stress degradation (e.g., $\Delta Vp(t_3)$ of FIG. 4B) and recovered stress degradations (e.g., $\Delta Vp_{0-3}$ of FIG. 4B) can be calculated, as described above, for a number of (at least two) values of simulation transient times and stored in memory. At step 520, the calculated stress degradations and recovered stress degradations along with their respective effective times can be used in an extrapolation calculation over time to find predicted values of the stress degradation and recovered stress degradations for a defined age of the device. For example, the simulation transient times can be of the order of microseconds (e.g., 5 μsec and 10 μsec), whereas the defined age of the device can be in the range of many months or years (e.g., 10 years). The predicted stress degradation and recovered stress degradations can be calculated, using the extrapolation for a number of defined age values of the device and output. At step 530, the predicted recovered stress degradation is projected on BTI sensitive model parameters or directly on the key operation values such as the threshold voltage Vth or the drain current Ids. The mentioned device model parameters and key operation values can be loaded by an EDA simulator to represent the device degraded electrical behavior after the user defined aging time.

Figure 6:
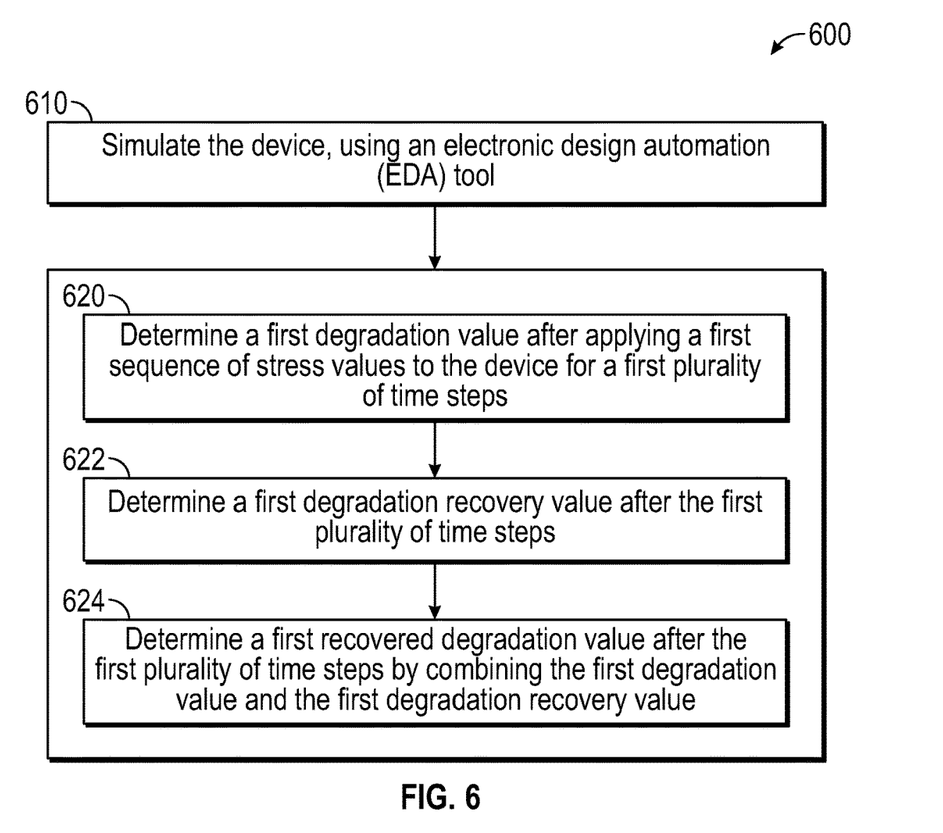
FIG. 6 is a flow diagram illustrating an example method for BTI calculation of a device according to certain aspects of the disclosure.

FIG. 6 is a flow diagram illustrating an example method 600 for BTI calculation of a device according to certain aspects of the disclosure. While FIG. 6 is described with reference to FIG. 1, it should be noted that the process steps of FIG. 6 may be performed by other systems. The process 600 begins by proceeding to step 610, when the device is simulated, using an electronic design automation (EDA) tool (e.g., by 110, 120, or 130 of FIG. 1). The process continues with step 620, when a first degradation value (e.g., $\Delta Vp_{0-3}$ of FIG. 3A) is determined after applying a first sequence of stress values (e.g., Vs1, Vs2, and Vs3 of FIG. 4B) to the device for a first plurality of time steps. At step 622, a first degradation recovery value is determined after the first plurality of time steps (e.g., $\Delta Vp_{rec3}$ of FIG. 4B). Finally at step 624, a first recovered degradation value (e.g., $\Delta Vp(t_3)$ of FIG. 4B) is determined after the first plurality of time steps by combining the first degradation value and the first degradation recovery value. The first degradation value, the first degradation recovery value, and the first recovered degradation value (e.g., $\Delta Vp(t_3)$ of FIG. 4B) are associated with a parameter of the device (e.g., Vth, Vfb, μ). The simulation is a transient analysis simulation, and the device is an advanced FINFET or MOSFET device.

Hardware Overview

Figure 7:
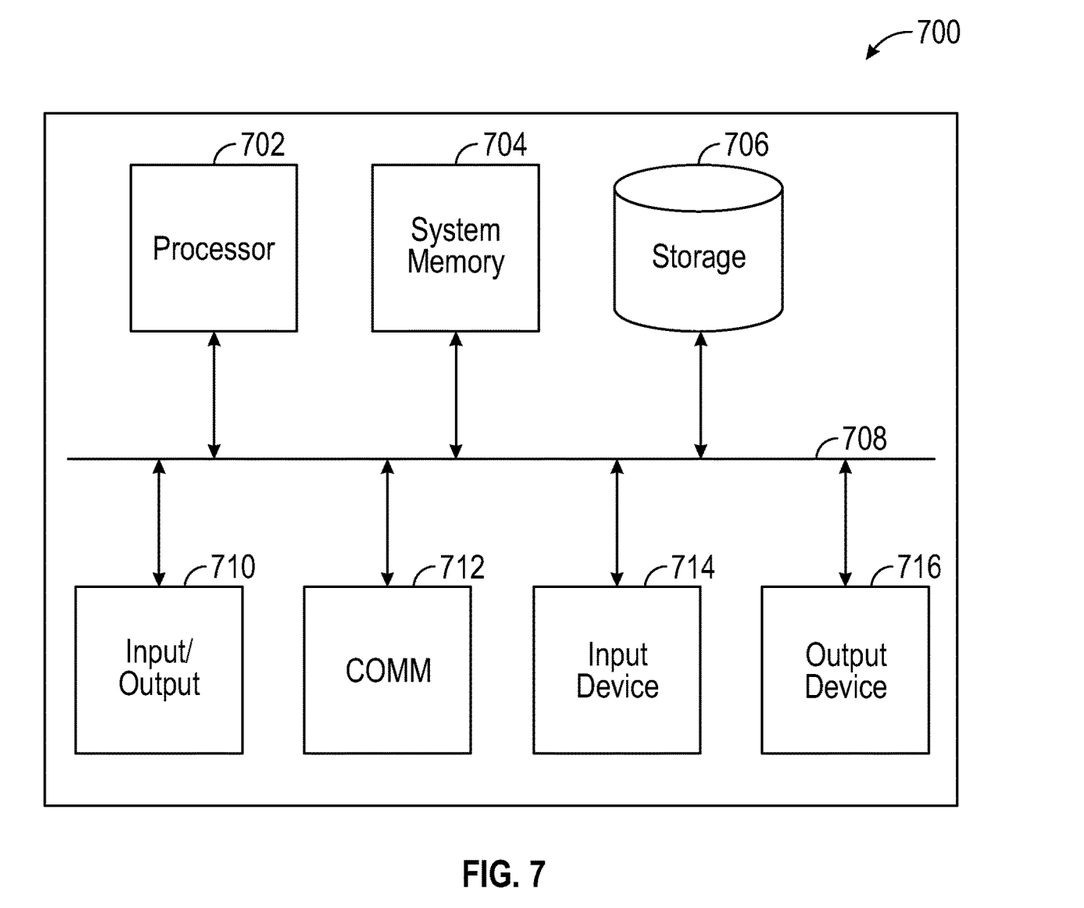
FIG. 7 is a block diagram illustrating an example computer system with which simulation software of the subject technology can be implemented.

FIG. 7 is a block diagram illustrating an example computer system with which simulation software and hardware emulators of the subject technology can be implemented. In some aspects, the computer system 700 may represent the server 110, the computing device 120, the mobile computer 130, and the mobile device 140 of FIG. 1. In certain aspects, the computer system 700 may be implemented using hardware or a combination of software and hardware, either in a dedicated server, or integrated into another entity, or distributed across multiple entities.

Computer system 700 (e.g., server 110 or the computing device 120) includes a bus 708 or other communication mechanism for communicating information, and a processor 702 coupled with bus 708 for processing information. According to one aspect, the computer system 700 can be a cloud computing server of an infra-structure-as-a-service (IaaS) and can be able to support platform-as-a-service (PaaS) and software-as-a-service (SaaS).

Computer system 700 can include, in addition to hardware, code that creates an execution environment for the computer program in question, e.g., code that constitutes processor firmware, a protocol stack, a database management system, an operating system, or a combination of one or more of them stored in an included memory 704, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 708 for storing information and instructions to be executed by processor 702. The processor 702 and the memory 704 can be supplemented by, or incorporated in, special purpose logic circuitry.

The instructions may be stored in the memory 704 and implemented in one or more computer program products, i.e., one or more modules of computer program instructions encoded on a computer readable medium for execution by, or to control the operation of, the computer system 700, and according to any method well known to those of skill in the art A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 700 further includes a data storage device 706 such as a magnetic disk or optical disk, coupled to bus 708 for storing information and instructions. Computer system 700 may be coupled via input/output module 710 to various devices. The input/output module 710 can be any input/output module. Example input/output modules 710 include data ports such as USB ports. In addition, input/output module 710 may be provided in communication with processor 702, so as to enable near area communication of computer system 700 with other devices. The input/output module 710 may provide, for example, for wired communication in some implementations, or for wireless communication in other implementations, and multiple interfaces may also be used. The input/output module 710 is configured to connect to a communications module 712. Example communications modules 712 (e.g., interfaces 125 and 135 of FIG. 1) may include networking interface cards, such as Ethernet cards and modems.

In certain aspects, the input/output module 710 is configured to connect to a plurality of devices, such as an input device 714 and/or an output device 716. Example input devices 714 include a keyboard and a pointing device, e.g., a mouse or a trackball, by which a user can provide input to the computer system 700. Other kinds of input devices 714 can be used to provide for interaction with a user as well, such as a tactile input device, visual input device, audio input device, or brain-computer interface device.

According to one aspect of the present disclosure, the server 110 and workstation 120 can be implemented using a computer system 700 in response to processor 702 executing one or more sequences of one or more instructions contained in memory 704. Such instructions may be read into memory 704 from another machine-readable medium, such as data storage device 706. Execution of the sequences of instructions contained in main memory 704 causes processor 702 to perform the process steps described herein. One or more processors in a multi-processing arrangement may also be employed to execute the sequences of instructions contained in memory 704. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer-implemented method for bias temperature instability (BTI) calculation of a device, the method comprising:
   simulating the device, using an electronic design automation (EDA) tool, the simulation comprising:
      determining a first degradation value after applying a first sequence of stress values to the device for a first plurality of time steps;
      determining a first degradation recovery value by determining a step degradation recovery value after each time step following a second time step of the first plurality of time steps, wherein the step degradation recovery value is determined based on a respective previous step degradation value; and
      determining a first recovered degradation value after the first plurality of time steps by combining the first degradation value and the first degradation recovery value, wherein:
         the first degradation value, the first degradation recovery value, and the first recovered degradation value are associated with a parameter of the device.

2. The method of claim 1, further comprising determining a first effective stress time associated with the first recovered degradation value, wherein the first effective stress time is different from a sum of the first plurality of time steps.

3. The method of claim 2, wherein the first sequence of stress values includes a last stress value applied for a last time step of the first plurality of time steps, and wherein the first effective stress time comprises a time duration corresponding to a degradation of the parameter of the device if only the last stress value was applied for an entire time duration.

4. The method of claim 2, further comprising determining a second recovered degradation value after applying a second sequence of stress values for a second plurality of time steps.

5. The method of claim 4, further comprising determining a second effective stress time associated with the second recovered degradation value, wherein the second effective stress time is different from a sum of the second plurality of time steps.

6. The method of claim 5, further comprising determining a first effective recovery time associated with the first degradation recovery value and a second effective recovery time associated with a second degradation recovery value.

7. The method of claim 6, further comprising determining a recovered degradation value for a predefined aging time of the device based on the first recovered degradation value, the second recovered degradation value, the first effective stress time, and the second effective stress time, using an extrapolation technique.

8. The method of claim 1, wherein the simulation comprises a transient analysis simulation, wherein the device comprises a field-effect transistor (FET) device, wherein the FET device comprises a FINFET or a MOSFET device, and wherein determining the first degradation value comprises determining a step degradation value after each time step following a first time step of the first plurality of time steps.

9. The method of claim 1, wherein determining the first recovered degradation value comprises determining a step recovered degradation value after each time step following a second time step of the first plurality of time steps.

10. The method of claim 1, wherein applying a stress value comprises applying a higher than nominal value of a bias voltage or current or operating temperature to the device.

11. The method of claim 1, wherein determining the first degradation value is based on a selected degradation model, and wherein determining the first degradation recovery value is based on a selected degradation recovery model.

12. The method of claim 11, wherein the selected degradation model and the selected degradation recovery model comprise complex equations including logarithmic equations or power law plus logarithmic equations.

13. A system for bias temperature instability (BTI) calculation of a device, the system comprising:
   a server configured to perform a transient analysis simulation of the device; and
   a workstation communicatively coupled to the server and configured to provide a degradation model and a degradation recovery model to the server, wherein:
   the server is configured to:
      determine, using the degradation model, a first degradation value after applying a first sequence of stress values to the device for a first plurality of time steps;
      determine, using the degradation recovery model, a first degradation recovery value by determining a step degradation recovery value after each time step following a second time step of the first plurality of time steps, wherein the step degradation recovery value is determined based on a respective previous step degradation value; and determine a first recovered degradation value after the first plurality of time steps by combining the first degradation value and the first degradation recovery value, and wherein:
the first degradation value, the first degradation recovery value, and the first recovered degradation value are associated with a parameter of the device.

14. The system of claim 13, wherein the server is further configured to determine a first effective stress time associated with the first recovered degradation value, wherein the first effective stress time is different from a sum of the first plurality of time steps.

15. The system of claim 14, wherein the server is further configured to determine a second recovered degradation value after applying a second sequence of stress values for a second plurality of time steps.

16. The system of claim 15, wherein the device comprises a field-effect transistor (FET) device, wherein the FET device comprises a FINFET or MOSFET device, wherein the server is further configured to determine a second effective stress time associated with the second recovered degradation value, and wherein the second effective stress time is different from a sum of the second plurality of time steps.

17. The system of claim 16, wherein the server is further configured to determine a first effective recovery time associated with the first degradation recovery value and a second effective recovery time associated with a second degradation recovery value.

18. The system of claim 17, wherein the server is further configured to determine a recovered degradation value for a predefined aging time of the device based on the first recovered degradation value, the second recovered degradation value, the first effective stress time, and the second effective stress time, using an extrapolation technique.

19. A non-transitory machine-readable storage medium comprising machine-readable instructions for causing a processor to execute a method for bias temperature instability (BTI) calculation of a device using a transient analysis simulation, the method comprising:
determining, using an arbitrary degradation model, a degradation value after applying a sequence of stress values to the device for a plurality of time steps;
determining, using an arbitrary degradation recovery model, a degradation recovery value by determining a step degradation recovery value after each time step following a second time step of the first plurality of time steps, wherein the step degradation recovery value is determined based on a respective previous step degradation value; and
determining a recovered degradation value after the plurality of time steps by combining the degradation value and the degradation recovery value, wherein:
the degradation value, the degradation recovery value, and the recovered degradation value are associated with one or more model parameters of the device,
the device comprises an advanced FINFET or MOSFET device.

* * * * *